United States Patent [19]

Nadkarni

[11] Patent Number: 5,096,860

[45] Date of Patent: Mar. 17, 1992

[54] PROCESS FOR PRODUCING UNAGGLOMERATED SINGLE CRYSTALS OF ALUMINUM NITRIDE

[75] Inventor: Sadashiv K. Nadkarni, Jonquiere, Canada

[73] Assignee: Alcan International Limited, Montreal, Canada

[21] Appl. No.: 528,878

[22] Filed: May 25, 1990

[51] Int. Cl.$^5$ .............................................. C04B 35/58
[52] U.S. Cl. ........................................ 501/96; 501/86; 501/153; 423/137; 423/363; 156/600; 156/620.5
[58] Field of Search ............... 501/96, 86, 100, 153; 423/412, 363, 137; 156/600, 620.5

[56] References Cited

U.S. PATENT DOCUMENTS

| | | | |
|---|---|---|---|
| 3,032,398 | 5/1962 | Clair | 501/96 |
| 3,607,014 | 9/1971 | Huml et al. | 423/495 |
| 4,481,300 | 11/1984 | Hartnett et al. | 501/153 |
| 4,540,673 | 9/1985 | Takeda et al. | 501/97 |
| 4,615,863 | 10/1986 | Inoue et al. | 501/96 |
| 4,618,592 | 10/1986 | Kuramoto et al. | 501/96 |
| 4,650,777 | 3/1987 | Kurokawa et al. | 501/96 |
| 4,806,330 | 2/1989 | Melling et al. | 423/412 |
| 4,869,925 | 9/1989 | Hiai et al. | 501/96 |
| 4,908,173 | 3/1990 | Schwetz et al. | 501/98 |

FOREIGN PATENT DOCUMENTS

| | | |
|---|---|---|
| 266927 | 5/1988 | European Pat. Off. . |
| 62-132711 | 6/1987 | Japan . |
| 63-055108 | 3/1988 | Japan . |
| 01133983 | 5/1989 | Japan . |

*Primary Examiner*—William R. Dixon, Jr.
*Assistant Examiner*—Sue Hollenbeck
*Attorney, Agent, or Firm*—Cooper & Dunham

[57] ABSTRACT

A process for producing unagglomerated single crystals of aluminum nitride having a size of at least 10 microns suitable for the reinforcement of metal and ceramic matrix composite materials. The process involves reacting alumina (or a precursor) with carbon under an atmosphere of nitrogen (or a precursor such as ammonia or an amine) at a temperature in the range of 1800°–1950° C. in the presence of an alkaki metal oxide (or precursor such as a carbonate) as a crystal growth promoter or catalyst. The alkali metal oxide is present in an amount required for the formation of crystals of the required size, preferably in the range of 10–60 microns. Particularly desirable crystals are produced if electrostatic precipitator dust is used as a source of the alumina, if petroleum coke or calcined anthracite coal is used as a source of the carbon and if the reaction is carried out in the presence of a porosity enhancer for the reaction mass, especially short cellulose fibres. The particles produced by the invention are in the form of large single crystals for good matrix reinforcement and may have low oxygen and carbon contents. The invention extends to the particles produced by the process and to matrix composites reinforced with the particles.

27 Claims, 6 Drawing Sheets

PROCESS FOR PRODUCING UNAGGLOMERATED SINGLE CRYSTALS OF ALUMINUM NITRIDE

BACKGROUND OF THE INVENTION

I. Field of the Invention

This invention relates to a process for producing substantially unagglomerated single crystals of aluminum nitride.

II. Description of the Prior Art

There is considerable interest nowadays in materials suitable for the reinforcement of metal or ceramic matrix composites and similar materials. Composite materials of this type can be made to have very desirable properties, such as lightness of weight, high strength and resistance to high temperatures. Materials used for the reinforcement of the matrices must themselves have desirable properties, such as resistance to high temperatures and good resistance to attack by the matrix materials at high temperatures, as well as imparting a substantial reinforcing effect.

One material that is of interest as a matrix reinforcement is aluminum nitride. This material is especially suited for the reinforcement of aluminum matrix composites because of its high resistance to attack by molten aluminum. However, the reinforcing effect obtainable when using this material has been lower than expected because it has not been possible, at least on a commercial scale, to produce aluminum nitride in the form of particles ideally suited for reinforcement.

Aluminum nitride is used in the electronics industry, but the processes for the production of aluminum nitride for these applications generally result in the formation of sub-micron sized particles, which are too small for effective matrix reinforcement.

Most attempts to date to produce particles of aluminum nitride intended for reinforcement have resulted in polycrystalline particles which are then sintered and classified to obtain particles in the size range of about 10 microns. For example, individual particles can be produced by a carbothermal process for the production of aluminum nitride according to the following equation:

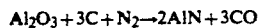

$$Al_2O_3 + 3C + N_2 \rightarrow 2AlN + 3CO$$

This reaction takes place at temperatures above 1700° C. but, in order to grow crystals above 10 microns in diameter, the reaction temperature must be maintained above 1800° C. However, when such temperatures are used, the product is unsatisfactory because a significant amount of carbon becomes trapped between agglomerating crystals of the AlN and the trapped carbon cannot be eliminated even by oxidation at elevated temperatures. Besides, a thick, almost sintered layer of AlN is formed on the surface of the particles, which hinders the diffusion of $N_2$ inside the particle matrix as it is being formed, thus causing incomplete reaction in the interior of the particles.

OBJECTS OF THE INVENTION

The reinforcing effect produced by sintered, polycrystalline, agglomerated or unduly small particles of aluminum nitride has proven to be unsatisfactory for some purposes and it is therefore an object of the present invention to provide a process for producing large, unagglomerated single crystals of aluminium nitride which can impart an improved reinforcing effect to metal and ceramic matrices, and to other produces.

Another object of the present invention is to provide such a process capable of being operated on a commercial scale at reasonable cost.

SUMMARY OF THE INVENTION

According to one aspect of the present invention, there is provided a process for producing substantially unagglomerated single crystals of aluminum nitride which comprises reacting alumina or a precursor thereof and carbon and/or a precursor thereof in the presence of nitrogen or a precursor thereof at a temperature in the range of about 1700° to 1950° C., said reaction being carried out in the presence of an alkali metal oxide or a precursor thereof as a crystal growth promoter and/or catalyst in an amount sufficient to produce single crystals of AlN having sizes of at least about 10 microns.

The invention also relates to substantially unagglomerated single single crystals of aluminum nitride produced by the above process and to matrix composite materials reinforced with such single crystals of aluminum nitride.

DETAILED DESCRIPTION OF THE PRESENT INVENTION

Figure 1:
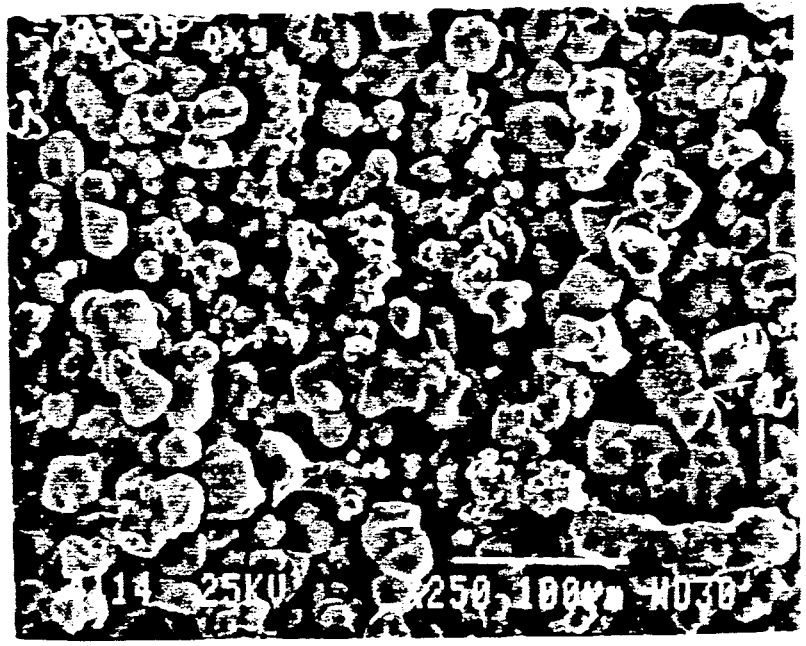
FIGS. 1 to 4, 8, 9 and 10 of the accompanying drawings are photomicrographs of particles produced by the methods described in the following Examples and Comparative Examples.
Figure 2:
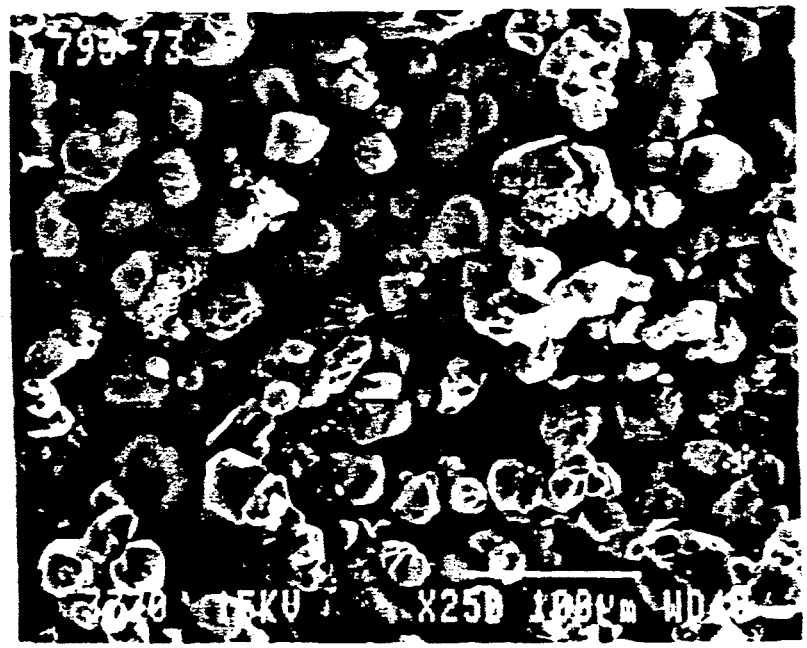
Figure 3:
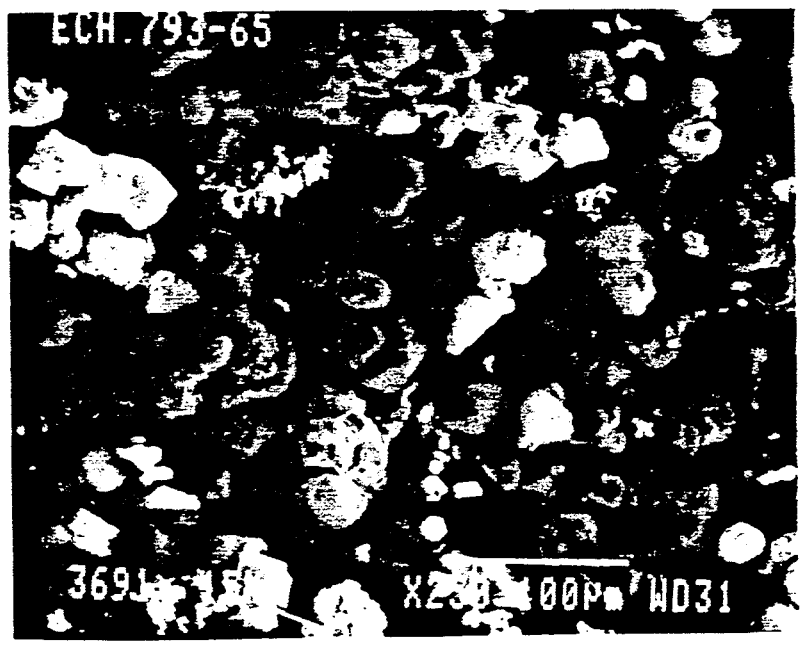
Figure 4:
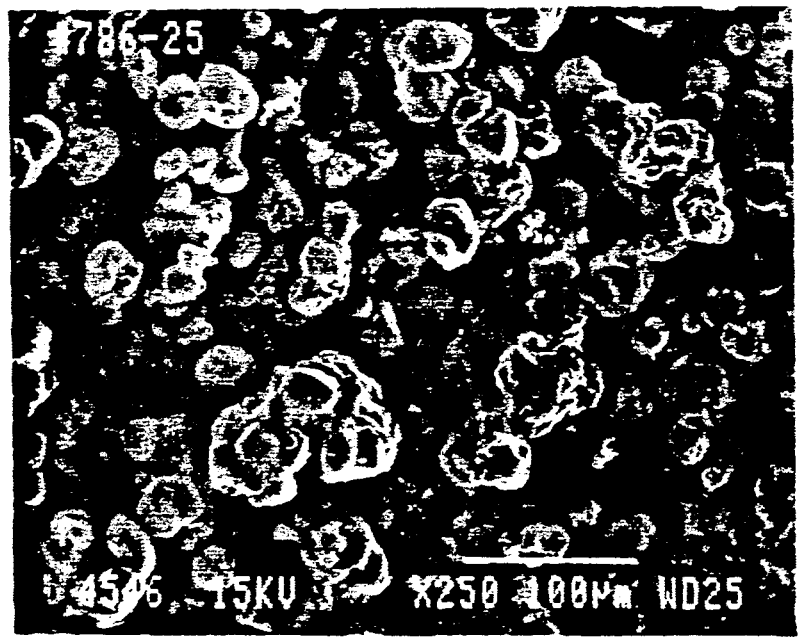

It has been found that the matrix reinforcing effect obtainable by the use of aluminum nitride is particularly high if the aluminum nitride can be obtained in the form of large single crystals, possibly because of the high tensile strength of such crystals compared to polycrystalline particles. Ideally, the crystals should be in the size range of 10 to 100 microns in diameter, or more preferably 10 to 60 microns in diameter, for the optimum reinforcing effect, depending on the application.

In the present invention, the carbothermal reaction for the production of aluminum nitride is modified by employing an alkali metal oxide as a crystal growth (grain growth) promoter and/or catalyst. When such oxides or precursors thereof are employed, agglomeration and sintering of the AlN particles normally observed during this type of reaction is substantially prevented, even at temperatures above 1800° C. The crystals thus formed can grow as approximately spherical particles having diameters in the desired range of 10–60 microns. By preventing such agglomeration and sintering, the problem of nitrogen diffusion is also much reduced and any excess carbon can be removed from the product by oxidation.

The preferred alkali metal oxides are $Na_2O$ and $K_2O$, but $Li_2O$ and $Rb_2O$ may also be used, although the high cost of the latter two oxides would make their use on a commercial scale most probably unattractive. Instead of using the alkali metal oxides themselves, precursors which are converted to the oxides under the reaction conditions, such as alkali metal carbonates, bicarbonates, oxalates, acetates and nitrates, may alternatively be employed. Particularly preferred is $Na_2CO_3$ when the alkali metal oxide is to be $Na_2O$.

The amount of alkali metal oxide required for the reaction is any amount which produces the desired growth of single crystals of the desired size under the reaction conditions. The minimum amount of alkali metal oxide required to achieve this result is normally about 0.3 parts by weight of the alkali metal oxide (or precursor calculated as the oxide) per 100 parts by weight of alumina (or the precursor calculated as alumina). There is no particular maximum amount but, in most cases, there is no advantage to using more than about 20 parts by weight (or even more than 10 parts by weight) of the alkali metal oxide (or the precursor calculated as the oxide) for every 100 parts by weight of the alumina (or the precursor calculated as alumina) used in the reaction. A particularly preferred range is about 2 to 5 parts by weight of the alkali metal oxide per 100 parts by weight of the alumina, especially when the oxide is $Na_2O$. As the amount of alkali metal oxide is increased within the above range, larger crystals are generally formed and the percentage of small crystals in the produce tends to be reduced.

The reason why the alkali metal oxides act as crystal growth promoters and/or catalysts is not precisely known and the present invention should not be bound by any particular theory. However, it is presently speculated that the alkali metal oxides first react with the alumina to form compounds of the nature $Na_2O.xAl_2O_3$ (using $Na_2O$ as an example). Such compounds would have a lower free energy than both $Na_2O$ and $xAl_2O_3$ and thus react with C and $N_2$ according to the reaction:

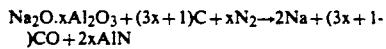
$$Na_2O.xAl_2O_3+(3x+1)C+xN_2 \rightarrow 2Na+(3x+1)CO+2xAlN$$

The temperature at which the free energy becomes negative for this reaction is higher than for the following reaction:

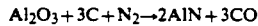
$$Al_2O_3+3C+N_2 \rightarrow 2AlN+3CO$$

This means that the formation of AlN takes place at higher temperatures as the $Na_2O$ content increases. This is believed to result in the synthesis of larger crystals of AlN than those formed at lower temperatures without the alkali metal oxide. The larger crystals formed in this manner are also less likely to agglomerate and to trap carbon.

The nature of the other starting materials and the reaction conditions can also be important for the production of an optimum product, and these materials and conditions are detailed below.

The reaction of the invention is carried out at a temperature in the range of 1700° C. to 1950° C., more preferably 1800° C. to 1900° C. At higher temperatures there is an increasing risk of sintering the crystals and at lower temperatures large crystals tend not to be formed for the reasons given above, and also the rates of reaction are substantially lower.

The other starting materials required for the reaction of the invention are alumina or a precursor thereof, carbon and/or a precursor thereof and nitrogen or a precursor thereof. Alumina itself is normally employed in the reaction, although precursors such as aluminum carbonate, oxalate, acetate, or other oxygen-containing compound may be utilized, if desired. A particularly preferred form of alumina for the invention is ESP dust, which is an impure form of alumina obtained from electrostatic precipitators used for purifying waste gases, e.g. gases generated by alumina calciners during the production of pure alumina from bauxite. ESP dust is a well known and commercially available product which is supplied in the form of a very fine powder. Typically more than 90% by weight of the material is less than 44 microns in size. It consists of a mixture of calcined, partially calcined and uncalcined particles, and so its loss on ignition can vary between 1 and 35% by weight, but is typically less than 5%. ESP dust is highly amorphous and is further characterized by containing more than 0.3% by weight $Na_2O$, typically from 0.3 to 0.7% by weight or even up to 1% by weight or more, which can be used as the entire source of alkali metal oxide required for the present invention, or as a partial source when additional alkali metal oxide is employed. ESP dust is the preferred form of alumina for use in the present invention because it results in the formation of a very pure unagglomerated AlN product containing a lower amount of trapped carbon material than is obtained by using commercial metallurgical grade alumina. The reason for this is not precisely known, but is may be due to the fact that ESP dust already contains an alkali metal oxide thoroughly and evenly dispersed throughout the alumina. The amorphous structure may also be more reactive than crystallized forms found in other grades of calcined alumina.

The carbon employed in the present invention is preferably carbon derived from a source selected from petroleum coke and a non-graphitizable form of hard carbon, particularly anthracite coal. Petroleum coke is a well known product available from many sources and such coke of any type from any source can be employed in the present invention. Petroleum coke is generally produced by calcining green petroleum coke, which is in turn produced by the cokifaction of the residuum resulting from the distillation of petroleum. Particularly preferred for use in the present invention is undercalcined petroleum coke produced as a by-product during the calcination of green petroleum coke. Petroleum coke contains various impurities and is believed that these impurities affect the reaction of the present invention in ways which favour the growth of platelets.

Anthracite coal is a naturally occurring source of nongraphitizable hard carbon which generally contains impurities such as Fe, Si, Al, Ca, Ti, etc. These impurities, after calcination of the anthracite, are present as carbides. It is believed that the presence of such impurities in anthracite increases its reactivity with the alumina, although the improved reactivity may also be due, at least in part, to the disordered physical structure of the anthracite (as shown by the fact that, even upon heating, the anthracite cannot be transformed into a crystalline form).

Anthracite generally contains less than about 10% by weight of volatile materials (normally 7-10%) and less than about 10% by weight of ash remaining after combustion (normally 4-10%). Anthracite is available from various mines around the world, but Pennsylvania anthracite is particularly preferred in the present invention because of its superior results. This anthracite is extremely dense (real density over 1.80) with porosity of less than 10%. A typical electrically calcined (1800°-2200° C.) Pennsylvania anthracite composition in percent by weight is shown in Table 1 below:

TABLE 1

| | |
|---|---|
| % Si | 1.3–2.0 |
| % Al | 1.1–1.3 |
| % Fe | 0.3–0.6 |
| % S | 0.3 |
| % Ca | 0.05–0.20 |
| % Ash | 6–10 |
| % Carbon | Balance |

The anthracite must be calcined before use at a temperature above about 1500° C. (preferably 1600°-2200° C. and optionally about 1800° C.). The only practical way of doing this is by electrical calcination during which an electrical current is passed directly through the coal. The calcination is carried out under a non-oxidizing atmosphere (e.g. an atmosphere of Ar, a vacuum, or the atmosphere generated by the reactants themselves) for a time suitable for the removal of substantially all of the volatiles (usually a few hours). The calcined product should be allowed to cool in the same non-oxidizing atmosphere. The calcined product usually contains 90–96% by weight of carbon, with the remainder being ash. The calcination step also converts the impurities from oxides to carbides. This pre-calcination step is important although the reason for this is not completely clear.

Whichever source of carbon is used in the present invention, it is desirable to supply at least a part of the carbon requirement in the form of a carbon precursor which introduces a degree of porosity into the reaction mixture to allow for the penetration of the nitrogen or nitrogen precursor into the interior of the reaction mass. This ensures that the nitridation takes place quickly and efficiently and results in the formation of a product having a lower oxygen content than would otherwise be the case. Products of low oxygen content are usually produced by the process of the present invention and crystals having oxygen contents below about 4% by weight, more often below about 1% by weight or even below about 0.4% by weight, can be obtained, especially when a porosity enhancer is employed. Crystals of low oxygen content are desirable because they have higher thermal conductivity than those of higher oxygen content, and this is especially useful for metal matrix composites.

Carbon precursors capable of acting as porosity enhancers for use in the present invention are generally precursors having very low yields of carbon, with the remainder of the material being volatile or gasifiable at high temperatures. When such materials are heated to the reaction temperature, the volatile materials diffuse out of the reaction mass and create a system of interconnecting pores. The volatilizable portion should represent about 10 and 90% by weight of the carbon precursor for effective behaviour. The porosity enhancers are preferably used in the form of short fibres which help to considerably introduce further porosity into the reaction mass because they prevent dense packing of the starting materials and the reaction mass. The fibres should not be too long or mixing of the starting materials will be inhibited nor too short or the porosity will not be suitably enhanced by the fibres. Ideally, the fibres have a length in the range of 0.5 to 5 mm and an aspect ratio (length to thickness) between 5 and 50. Cellulose fibres are the preferred porosity enhancers for use in the present invention, but fibres made of other materials, such as polystyrene, acrylics, phenolics and carbon, may be employed if desired. Normally, up to about 10% by weight of the total carbon required for the reaction is provided by the porosity enhancer. It has been found that the carbon yield of the fibre material should preferably be at least 10% to ensure that the reaction mass (or bed) does not collapse when the fibres volatilize.

The reaction of the present invention is carried out in the presence of nitrogen or a precursor, such as ammonia or an amine, which is converted to nitrogen in the reaction conditions. The atmosphere in the reaction zone may consist entirely of nitrogen or the precursor or may alternatively comprise a mixture of the nitrogen or precursor and a nonreactive gas, such as argon. Oxygen should be excluded to the extent possible to prevent oxidation of the carbon and contamination of the product with oxygen for the reasons given above. The nitrogen or precursor is normally employed at atmospheric pressure, but higher pressures or autogenous pressures may be employed, if desired. In any event, a stoichiometrical excess of nitrogen is normally provided.

The alumina and carbon may be used in relative amounts close to the stoichiometrical proportions, but the carbon is most preferably present at 5–20% excess. If an excess of carbon remains in the product, it may be removed by subjecting the product to oxidation in dry air or oxygen at a temperature of about 700° C. This temperature is high enough to oxidize the carbon but not high enough to oxidize the aluminum nitride or to increase its oxygen content significantly. Because the product is not agglomerated, the carbon is not trapped within the AlN particles, and oxidation takes place easily and completely.

The solid reactants are normally used in the form of particles having sizes below about 100 microns, and are preferably thoroughly mixed, e.g. by the use of a V blender, in order to make the reaction mixture as homogeneous as possible prior to the reaction.

The reaction, which may be carried out on a continuous or batchwise basis, is generally conducted in a closed reaction vessel, preferably having graphite walls. The reaction is generally complete after a reaction time of about 2 to 3 hours, after which the product is allowed to cool under the nitrogen or a non-reactive atmosphere, although oxygen may be introduced when the temperature of the product reaches about 700° C. to oxidize any excess carbon, unless a graphite reactor is used, the walls of which would oxidize if oxygen were introduced at this temperature.

The AlN particles produced by the present invention are substantially unagglomerated single crystals having diameters in the range of 10–100 microns and usually 10–60 microns. The crystals are usually approximately spherical and are especially useful for matrix reinforcement. The oxygen content is generally below 4% by weight, usually below 1% by weight, and often below 0.4% by weight. If necessary, the particles can be separated further by gentle attrition. Classification to isolate crystals of 5 to 25 microns, median 15 microns, may also be desirable. The yield obtained by this is usually about 80%, illustrating that the product of the process is very largely in the desired size range. Virtually all of the product is larger than 10, or even 20, microns.

When used for matrix reinforcement in the usual way, products showing a high reinforcing effect are obtained. For metal matrices, the particles usually make up 15–20% by wt. of the total product. For ceramic matrices, they may make up to 70% by wt. Ceramic matrices reinforced with the AlN crystals of the invention have good machinability because AlN is softer than other matrix reinforcements, such as SiC.

The crystals of the invention can also be used to reinforce monolithic ceramics and preforms that are later infiltrated with molten metals. Moreover, the crystals can be used in conjunction with smaller spheres of non-metallic material to provide a bi-modal particle size distribution. Such products produce a high green packing density in a preform. They can also be used to make preforms which give controlled shrinkage on sintering, which is particularly useful for making large monolithic ceramics.

The invention is illustrated in more detail by the following non-limiting Examples and Comparative Examples.

EXAMPLE 1

Alumina from electrostatic precipitators (ESP dust), petroleum coke fines, $Na_2CO_3$ and cellulose fibres (from Manville Corporation) were mixed together in the weight proportion of 100:38:10:15, respectively. The cellulose fibres were short (less than 5 microns) and, as a result could be easily mixed with the remainder of the solid reactants.

The resulting mixture was reacted at 1875° C. for 4 hours under an atmosphere of pure nitrogen. The weights of the reactants and products were as follows:
Reactants: 75.0 g
Products: 31.7 g
Yield after oxidation at 700° C.: 95.44%

The product was non-agglomerated and contained only 1.77% oxygen. The very low concentration of oxygen is attributed to the presence of the cellulose fibres in the matrix.

EXAMPLE 2

Four reaction mixtures were prepared in which different precursors were used. All four mixtures each contained 100 parts by weight of ESP dust containing 0.3% $Na_2O$; 38 parts by weight of undercalcined petroleum coke; and 15 parts by weight of cellulose fibres. To one mixture was added 12.6 parts by weight of sodium oxalate; to the third was added 15.9 parts by weight of sodium acetate; to the third was added 15.9 parts by weight of sodium bicarbonate; and to the fourth was added 13 parts by weight of potassium carbonate. These proportions provided the equivalent of 0.19 atomic weights of alkali metal per 100 parts of alumina in each case.

The mixtures were heated and kept at a temperature of 1875° C. for 3 hours under a nitrogen atmosphere. All mixtures produced unagglomerated particles between 20 and 30 microns in diameter containing about 1.7% by weight of residual oxygen.

This Example demonstrates that various alkali metal oxide precursors can be employed in the method of the invention without significantly affecting the result.

EXAMPLE 3

The procedure of Example 1 was followed except that the amount of $Na_2CO_3$ was varied in four separate reaction mixtures as follows:

| MIXTURE | AMOUNT OF $Na_2CO_3$ (PARTS BY WT) |
|---------|-----------------------------------|
| 1 | 0 |
| 2 | 2.5 |
| 3 | 5.0 |
| 4 | 10.0 |

The products obtained are shown in FIGS. 1, 2, 3 and 4, respectively, for mixtures 1, 2, 3 and 4. From these Figures it can be seen that increasing the amount of the $Na_2CO_3$ increases the size of the crystals and decreases the amount of small crystals. FIG. 1 shows that, in the absence of additional $Na_2CO_3$, the ESP dust contains sufficient $Na_2O$ to produce unagglomerated single crystals of AlN, a large number of which are 30 microns in diameter or larger, accompanied by a small number of small particles.

This Example thus demonstrates the effect of increasing the amount of $Na_2CO_3$ within the range specified by the present invention.

EXAMPLE 4

A mixture of ESP dust, undercalcined petroleum coke, $Na_2CO_3$ and cellulose in the ratio 100:38:5:15 by weight, respectively, was prepared and mixed for one hour in a V blender.

A 1.5 kg portion of the mixture was placed in a graphite crucible and heated in a continuous tunnel furnace. The furnace was programmed to keep the crucible in the hot zone at 1875° C. for three hours under an atmosphere of flowing nitrogen.

The product was a collection of single unagglomerated particles of AlN of 40 microns mean diameter, with a maximum size of up to 100 microns. The residual oxygen content of the crystals was between 0.4 and 0.9% by weight. For comparison purposes, the same reaction was duplicated in a small laboratory batch furnace and the residual oxygen content was about 1.8%.

This Example demonstrates that the reaction of the present invention can be carried out on a commercial scale and still achieve the desired results or, indeed, better results.

EXAMPLE 5

Metal matrix composites were prepared from AlN crystals (5 to 25 microns in size, median size 15 microns) produced according to the present invention, a commercial grade of AlN (AG35 produced by Advanced Refractory Technology) and from $Al_2O_3$.

Figure 5:
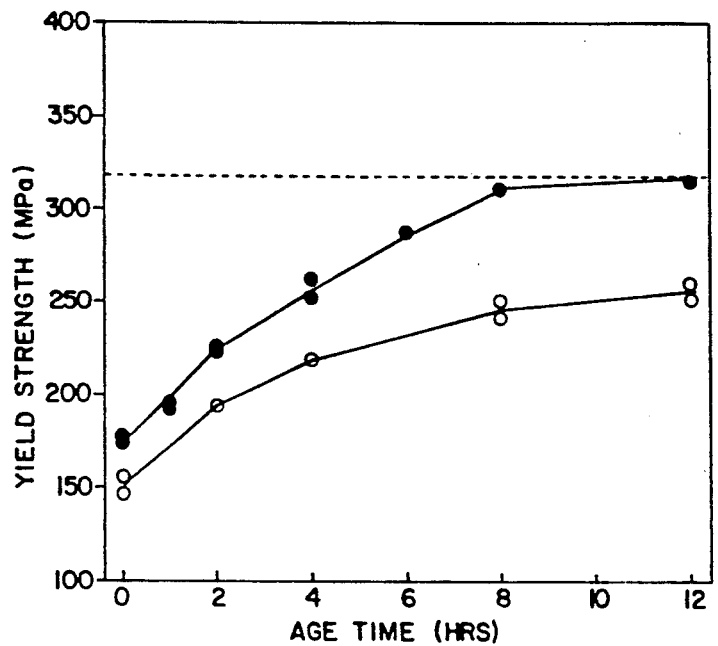
FIGS. 5, 6 and 7 are aging curves at 175° C. for various reinforcements at 15 vol.% in alloy AA6061 taken over a period of 12 hours.
Figure 6:
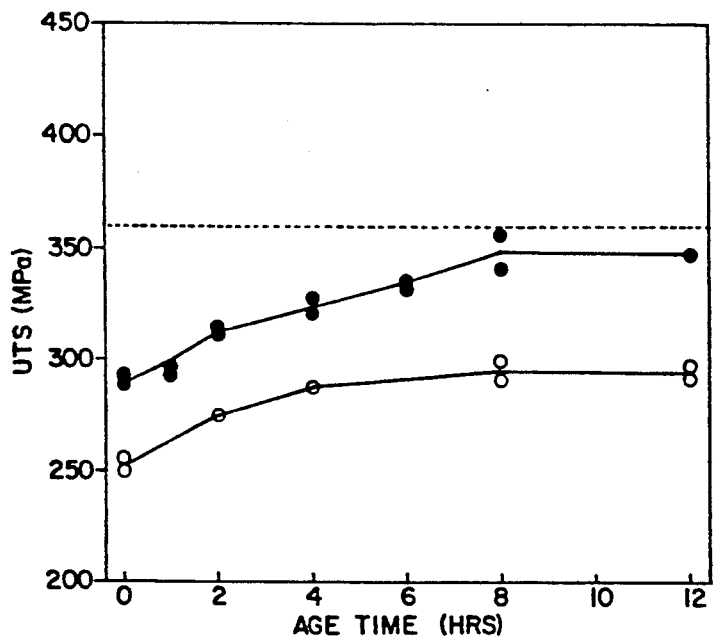
Figure 7:
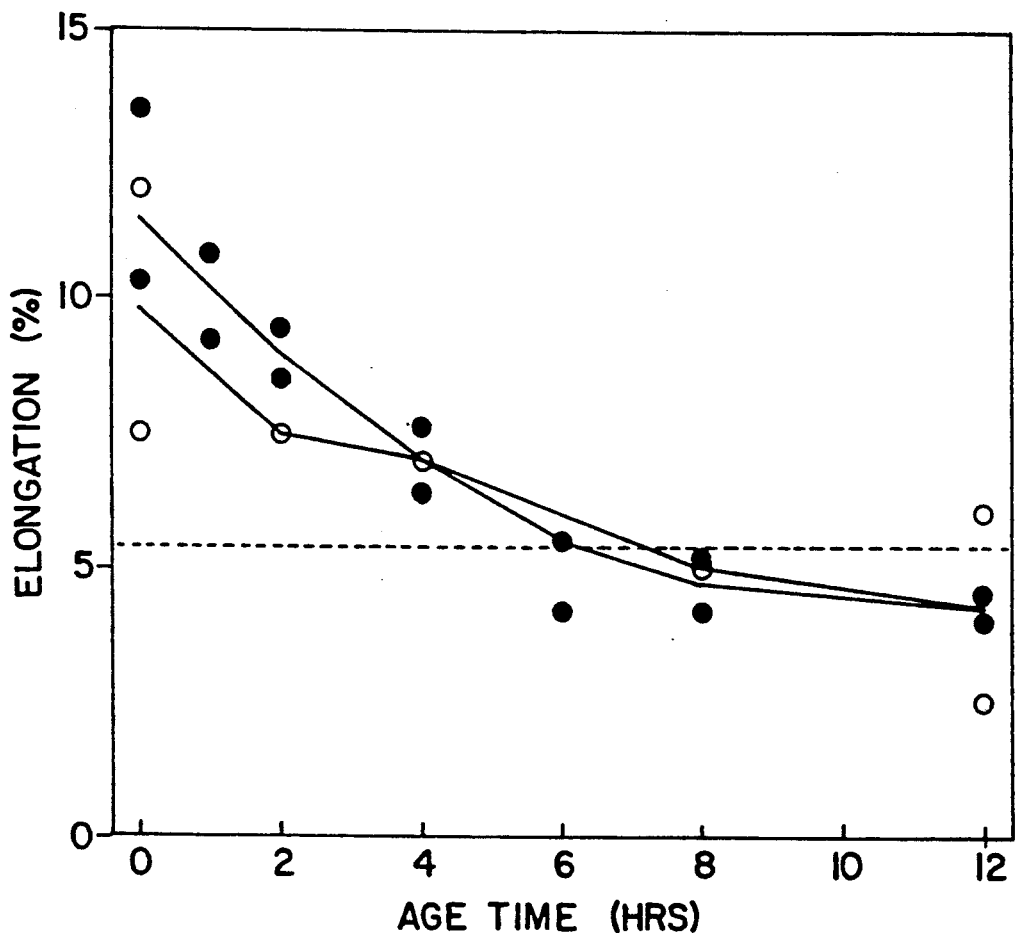

The powders were separately mixed into molten aluminum alloy AA-6061 to an amount of 15% by volume in a 3.5 lb. laboratory scale mixer using the method described in U.S. Pat. No. 4,786,467 to Skibo and Schuster (the disclosure of which is incorporated herein by reference). This involved charging the mixer with lumps of solid metal and reinforcing particles and then heating the contents under vacuum and an inert flushing atmosphere to a temperature at which the metal melts. Once the metal was molten, the stirring was begun. Test bars were machined from ⅜ inch extrusions and heat treated at 565° C. for two hours to homogenize them (redissolve some of the constituents that hard precipitated). Yield strength, ultimate tensile strength (UTS) and percent elongation were measured for various aging times. The results are shown in the graphs of FIGS. 5, 6 and 7, respectively, in which the solid circles (●) represent composites reinforced with AlN produced by the invention, open circles (○) represent the product including the commercial AlN and the dotted line represents the product including $Al_2O_3$. It is to be noted that for the $Al_2O_3$ reinforced material, only a single value is given, corresponding to the maximum value obtained at a peak aging time of six hours.

Examination of the product of the invention showed that the interface region between the AlN crystals and the metal was clean, without any evidence of interfacial reaction. The composite showed properties which are much better than the AlN (grade AG35) previously evaluated. In fact, the properties were very close to those for 15 vol% $Al_2O_3$ in AA-6061.

EXAMPLE 6

ESP dust, petroleum coke fines (−325 Tyler mesh) and $Na_2CO_3$ were mixed together in the weight ratio 100:35:10. The mixture was reacted at 1900° C. for three hours under an atmosphere of nitrogen. The weights of the reactants and products were as follows:

Reactants: 500 g
Products: 267.8 g

Figure 8:

The product (which is shown in FIG. 8) contained no carbon and was not agglomerated. The product also contained single crystals of AlN approximately 50 microns in diameter. However, the oxygen content of the product was very high (above 4%) due to the lack of porosity, because no fibres were mixed into the reactants, which resulted in little diffusion of nitrogen into the reactants.

This Example, however, demonstrates that, by using ESP dust as a source of alumina and $Na_2CO_3$ as a catalyst, the agglomeration of AlN can be prevented, but that cellulose fibres are preferred to result in complete reaction to AlN.

EXAMPLE 7

ESP dust, petroleum coke fines and $Na_2CO_3$ were mixed together in the weight ratio of 100:39:10. The mixture was reacted at 1925° C. for four hours. The weights of the reactants and the starting materials were as follows:

Reactants: 75 g
Products: 39.8 g
Yield After oxidation: 97.34%

The excess carbon was completely removed by oxidation at 700° C. The product was non-agglomerated and contained single crystals of AlN of about 50 microns in diameter. The oxygen content of the product was 2.75%. It was believed that the higher concentration of oxygen was due to inadequate nitrogen infiltration into the reaction mixture.

This demonstrates that, in the absence of a porosity enhancer such as cellulose, the product may have an undesirably high oxygen content.

COMPARATIVE EXAMPLE 1

Smelter grade alumina (C1) and anthracite dust (−325 Tyler mesh) were mixed together in the weight proportion of 100:40 and reacted at a temperature of 1950° C. for three hours under an atmosphere of nitrogen. The weights of the reactants and products were as follows:

Reactants: 500 g
Products: 317 g
After oxidation: 298 g

Substantial amounts of carbon remained trapped in the product. The product particles were polycrystalline with substantial agglomeration between the particles.

COMPARATIVE EXAMPLE 2

Smelter grade alumina (C1) and undercalcined petroleum coke dust were mixed together in the weight proportion of 100:50. The resulting mixture was reacted at 1950° C. for three hours under an atmosphere of nitrogen. The weights of the reactants and products were as follows:

Reactants: 500 g
Products: 313 g
After oxidation: 291 g

The product was higher agglomerated and, even after oxidation, a substantial amount of carbon remained trapped in the product.

COMPARATIVE EXAMPLE 3

In this Example, the same general conditions of Example 1 were used, except that the ESP dust was replaced by very high purity calcined alumina (99.9% pure). Two mixtures were prepared, both containing 100 parts by weight of the pure alumina, 38 parts by weight of undercalcined petroleum coke dust and 15 parts by weight of cellulose fibres. No $Na_2CO_3$ was added to the first mixture, but 10 parts by weight of $Na_2CO_3$ was added to the second mixture.

Figure 9:
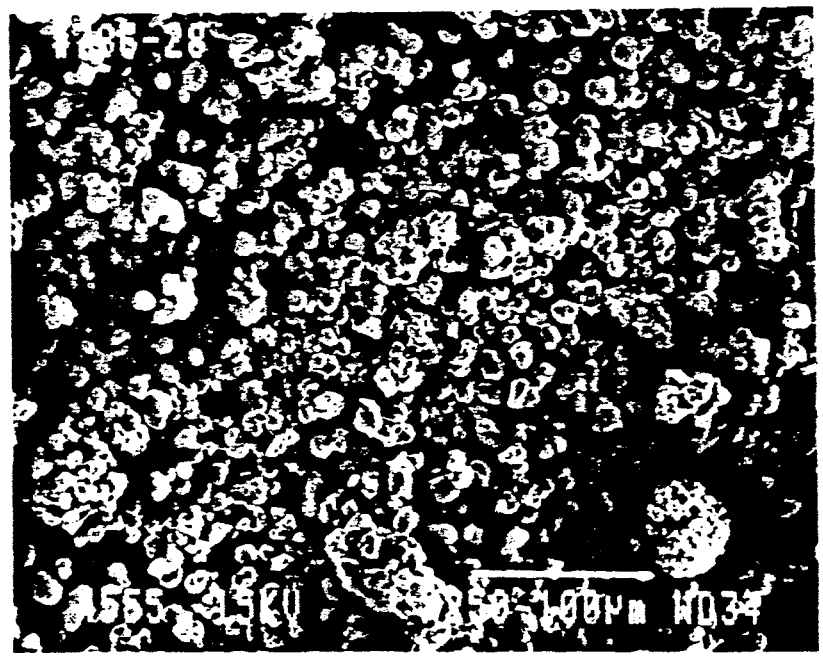
Figure 10:
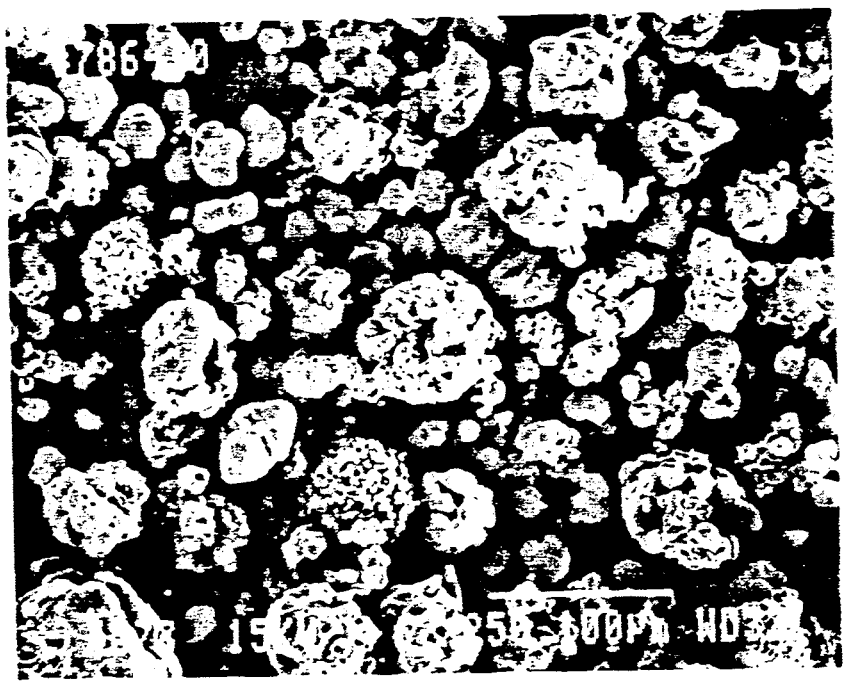

The mixtures were heated to 1875° C. for 4 hours under a nitrogen atmosphere. The products are shown in FIGS. 9 and 10, respectively, for no added $Na_2CO_3$ and for the added $Na_2CO_3$. FIG. 9 shows that, in the absence of $Na_2CO_3$, although particles of about 15 microns in diameter were formed, these were made up of smaller particles agglomerated together. On the other hand, in the presence of the $Na_2O$ precursor as shown in FIG. 10, larger AlN particles were obtained, but a considerable number were loosely agglomerated. Thus, the impurities in the ESP dust, or the crystal structure of the dust, seem to be desirable for the production of large (20 to 30 microns and larger) single particles of AlN.

This Example in conjunction with Example 1 indicates that ESP dust, already containing about 0.5% by weight of $Na_2O$, can be used as the lumina source without adding more alkali metal oxide precursor in order to obtain the large single crystals desired in the present invention.

What I claim is:

1. A process for producing substantially unagglomerated generally spherical single crystals of aluminum nitride, which comprises reacting alumina and carbon in the presence of nitrogen at a temperature in the range of about 1700° to 1950° C., said reaction being carried out in the presence of an alkali metal oxide in an amount sufficient to produce single crystals of AlN having diameters larger than about 10 microns.

2. A process according to claim 1 wherein said alumina is derived from a precursor thereof used as a starting material.

3. A process according to claim 1 wherein said nitrogen is derived from a precursor thereof used as a starting material.

4. A process according to claim 1 wherein said alkali metal oxide is derived from a precursor thereof used as a starting material.

5. A process according to claim 1 wherein at least a portion of said carbon is derived from a precursor thereof used as a starting material.

6. A process according to claim 1 wherein said alkali metal oxide is present in an amount of 0.3 to 20 parts by weight for every 100 parts by weight of said alumina.

7. A process according to claim 1 wherein said alkali metal oxide is used in an amount of 0.3 to 10 parts by weight for every 100 parts by weight of said alumina.

8. A process according to claim 1 wherein said alkali metal oxide is sodium oxide.

9. A process according to claim 1 wherein electrostatic precipitator dust is employed as a source of said alumina.

10. A process according to claim 1 wherein said reaction is carried out in the presence of a porosity enhancer capable of increasing the porosity of the reactants to permit permeation by said nitrogen.

11. A process according to claim 10 wherein said porosity enhancer is a carbon precursor.

12. A process according to claim 11 wherein said porosity enhancer comprises cellulose fibres.

13. A process according to claim 1 wherein said carbon is carbon derived from a source selected from the group consisting of petroleum coke and calcined anthracite coal.

14. A process according to claim 2 wherein said alumina precursor is a material selected from the group consisting of aluminum carbonate, aluminum oxalate and aluminum acetate.

15. A process according to claim 3 wherein said nitrogen precursor is a material selected from the group consisting of ammonia and amines.

16. A process according to claim 4 wherein said alkali metal oxide precursor is a material selected from the group consisting of carbonates, bicarbonates, oxalates, acetates and nitrates of alkali metals.

17. A process according to claim 1 wherein said alkali metal oxide is present in such an amount that said crystals have a diameter in the range of 10–100 microns.

18. A process according to claim 1 wherein the reaction is carried out at a temperature in the range of 1800°–1900° C.

19. A process according to claim 1 wherein said carbon is present in an amount in excess of a stoichiometrical amount relative to said alumina.

20. Generally spherical single crystals of aluminum nitride having diameters of at least 10 microns produced by reacting alumina and carbon in the presence of nitrogen at a temperature in the range of about 1700° to 1950° C., said reaction being carried out in the presence of an alkali metal oxide in an amount sufficient to produce said single crystals of AlN having diameters of at least 10 microns.

21. Crystals according to claim 20 having diameters in the range of 10–60 microns.

22. Crystals according to claim 20 having an oxygen content of less than about 4% by weight.

23. Crystals according to claim 20 having an oxygen content of less than about 1% by weight.

24. Crystals according to claim 20 having an oxygen content of less than about 0.4% by weight.

25. A composite material comprising a matrix made of a material selected from the group consisting of metal and ceramic, and a reinforcement in the form of generally spherical single crystals of aluminum nitride having diameters of at least 10 microns produced by reacting alumina and carbon in the presence of nitrogen at a temperature in the range of about 1700° to 1950° C., said reaction being carried out in the presence of an alkali metal oxide in an amount sufficient to produce said generally spherical single crystals of AlN having diameters of at least 10 microns.

26. A composite material according to claim 25 wherein said matrix material is a ceramic.

27. A composite material according to claim 25 wherein said matrix material is aluminum.

* * * * *